United States Patent [19]

Roshala

[11] Patent Number: 4,685,853
[45] Date of Patent: Aug. 11, 1987

[54] DEVICE FOR LOADING COMPONENTS INTO A CENTRIFUGE TO BE TESTED

[75] Inventor: John L. Roshala, Arcadia, Calif.

[73] Assignee: Trio-Tech, Burbank, Calif.

[21] Appl. No.: 902,570

[22] Filed: Sep. 2, 1986

[51] Int. Cl.⁴ .............................................. B65G 65/00
[52] U.S. Cl. ................................... 414/404; 414/414; 414/417; 414/786; 494/85
[58] Field of Search ............... 414/403, 404, 405, 411, 414/417, 786, 414; D24/22; 494/16, 85

[56] References Cited

U.S. PATENT DOCUMENTS 3,308,977 3/1967 Cochran et al. ................ 414/404 X
4,618,305 10/1986 Cedrone et al. ..................... 414/403

FOREIGN PATENT DOCUMENTS 244713 12/1985 Japan .................................. 414/417

*Primary Examiner*—Robert J. Spar
*Assistant Examiner*—Stuart J. Millman
*Attorney, Agent, or Firm*—Evanns & Walsh

[57] ABSTRACT

The method and device disclosed are for the testing of microelectronic components in a centrifuge. The method includes the steps of loading the components to be tested into a holder or stick and then providing a device controlling the dispensing of the microelectronic components from the holder into receptacles circularly arranged in an insert which fits into the rotor of the centrifuge. The control device in the form disclosed is in the form of a manual tool having a passageway into which the end of the holder can be extended. The tool is positioned between the holder and a receptacle in the insert so as to be able to control the dispensing of components into the receptacle or unloading them from the receptacle. The tool embodies a trigger and a plunger member actuatable thereby which can obstruct the passageway through the tool or to open the passageway for the passage of components through it.

11 Claims, 5 Drawing Figures

U.S. Patent  Aug. 11, 1987  Sheet 1 of 2  4,685,853
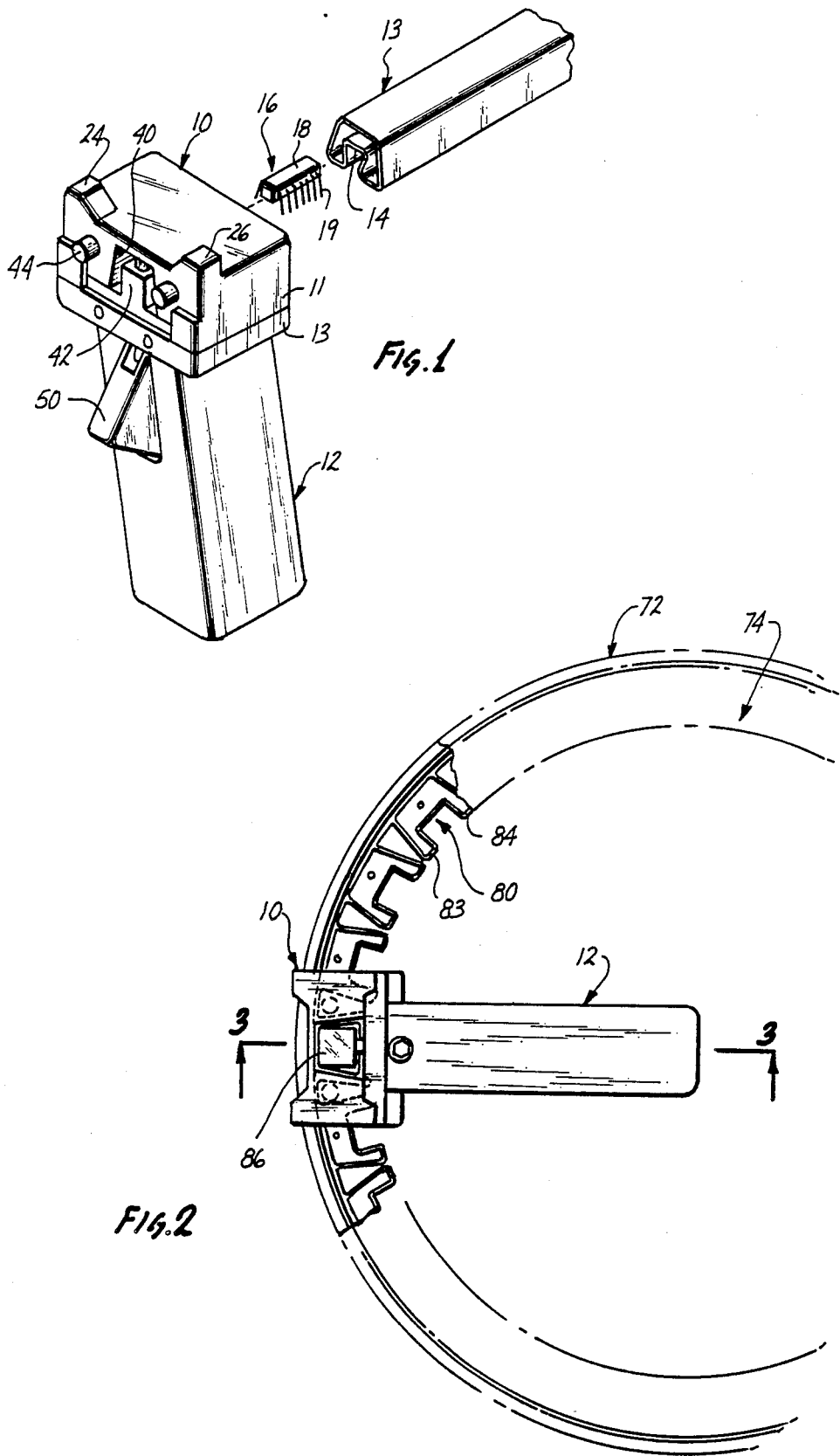

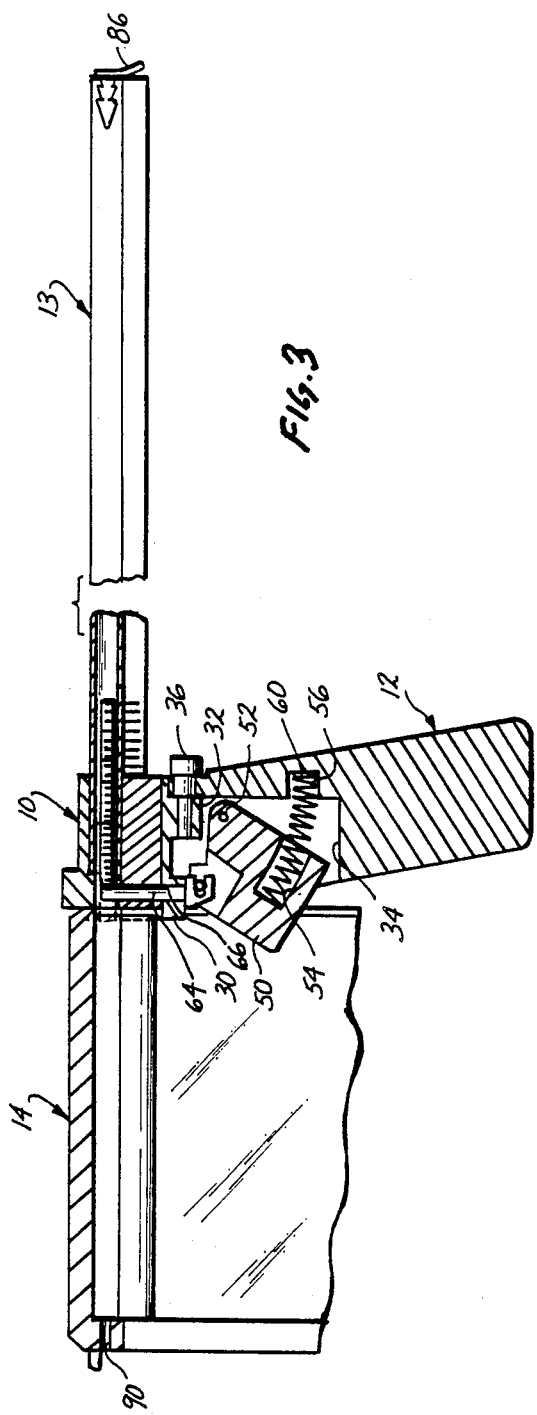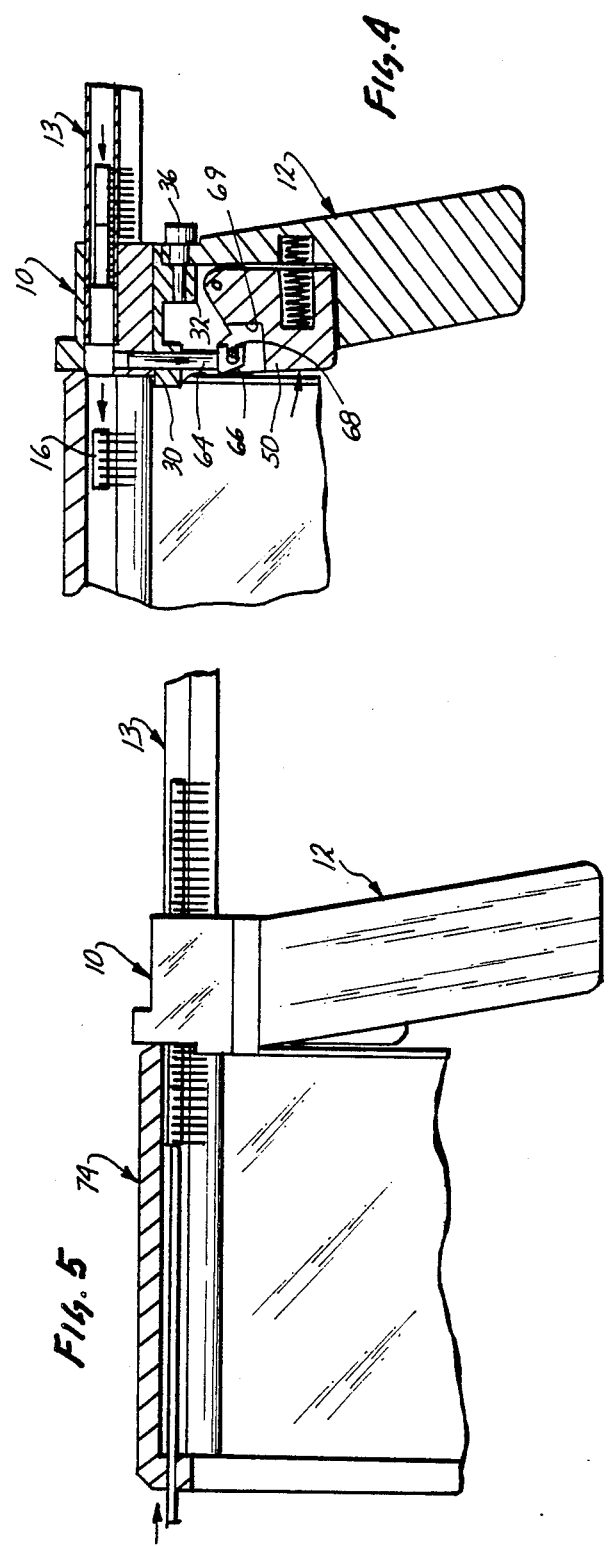

DEVICE FOR LOADING COMPONENTS INTO A CENTRIFUGE TO BE TESTED

BACKGROUND OF THE INVENTION

1. Field of the Invention

Broadly, the field of the invention is that of testing of components, such as microelectronic components for mechanical integrity, by subjecting them to high "G" forces in a centrifuge. More particularly, the invention is concerned with a device or instrumentality adapted for facilitating the dispensing or loading of the components into the centrifuge and unloading them from the centrifuge.

2. Description of the Prior Art

Semi-conductor microelectronic integrated circuits are produced in high volume. They are used extensively in various electronic products and systems for commercial and military applications. Microelectronic circuits are involved virtually everywhere in the line of manufacturing through final application of multifarious products, whether commercial radios, computers, microprocessors, or highperformance commercial or military aircraft or space vehicles and systems.

Integrated circuits must be reliable and frequently extremely high reliability is demanded. This requires not only the normal performance testing but also environmental testing where test requirements may be stringent and extreme. During manufacturing and testing, these items are extensively handled as individual items or in bulk or stick form. The state of the art of physically handling and manipulating these items, that is, these electronic components through the various stages of manufacturing and testing, has lagged, resulting in deficiencies and drawbacks in the handling of these items.

In the matter of centrifuge testing to determine mechanical integrity, the parts or components are subjected to high stresses of 20,000 to 30,000 G's of acceleration levels. It has been common practice in the art to load many individual integrated circuit units or components in a ring-type fixture, referred to as an insert force ring or rotor assembly, which is then set in the centrifuge and subjected to testing. After testing, the insert is removed and the parts unloaded and processed for further additional testing. For centrifuge testing, it has been the practice to manually load parts into the insert, and conversely, after testing, the parts are manually unloaded from the insert.

It is laborious and time consuming to manually load and unload individual parts, that is, components, during the transfer of parts to the inserts and back again. This problem in the art has not been satisfactorily met, and it is a primary purpose of the herein invention, a preferred embodiment of which is described in detail herein to meet this need in the art that has not previously been met.

SUMMARY OF THE INVENTION

A preferred form of the invention as described in detail hereinafter takes the form of a hand-held tool. The tool is constructed to be adapted to facilitate the handling of the parts, that is, the electronic components, and particularly to facilitate the loading of the parts into the centrifuge and the unloading of the parts from the centrifuge after the test has been made. The invention includes the method of loading and unloading using the tool.

The fixtures that are used included the insert that is placed into the rotor of the centrifuge and the "stick" or holder or magazine in which the parts are held for loading and into which the parts are received when unloading.

Typically, the insert is a circular member which fits into the rotor of the centrifuge. The insert may have circularly arranged vertical openings or slots which may be in the form of machined cavities. On the other hand, these vertical slots may be provided by way of extrusions fitting on the inside of the insert. The holder or magazine referred to as a "stick" is an elongated member, preferably formed of plastic and having a configuration so that its internal shape corresponds generally to the cross-section of the electronic component so that a plurality of the components can be loaded end to end in the holder. A typical electronic component may be an integrated circuit formed of a ceramic base having a plurality of terminal legs extending generally normal to it. The slots or receptacles in the insert provide openings or cavities also having a configuration or shape conforming generally to the cross-sectional shape of the components so as to receive them.

The device of the invention in its preferred form is a tool, as described herein, which is hand-held and is constructed to facilitate the loading of the components from the stick or holder into the cavities or openings in the insert and to facilitate the unloading of the components from the insert and back into the holder or stick.

In a preferred form of the invention, it embodies an upper part or cartridge having a passageway in it having a shape or configuration adapted to have the end of a holder or stick inserted into it and to have the electronic components pass through it and to then enter into one of the receptacle openings or cavities in the insert. In the preferred form of the invention, a plunger is provided which is movable from a position obstructing the said passageway through the cartridge and to a position in which the passageway is not obstructed. The tool is provided with a handle or grip extending from the cartridge, the grip embodying a manually actuatable trigger which can move the plunger between its two positions, that is, a position in which the said passageway is not obstructed and a position in which it is obstructed.

The tool is provided with positioning pins so that it can be accurately manually positioned relative to a cavity or receptacle opening in the insert and held there while electronic components feed from the stick or holder through the passageway in the cartridge into the receptacle opening. The tool is operable by the trigger to move the plunger into its unobstructing position to allow the feed or dispensing of the components into the insert and to stop or discontinue the feed with precision as desired by operating the trigger to move the plunger into its obstructing position.

From the foregoing, it is to be observed that the invention involves the method, as well as the tool itself, of controlling the feeding or dispensing of the components into the insert and discontinuing the feeding.

For purposes of unloading components from the insert after testing, preferably the insert is removed from the rotor of the centrifuge and placed in a position with its axis horizontal. The tool can then be positioned at the opposite end of individual cavities in the insert, and then the electronic components in that particular cavity can be pushed out so as to pass through the passageway in the tool and to be repositioned in the holder or stick, the end of which is again inserted into the tool. Thus, the tool facilitates both the loading of the components into the insert of the centrifuge and the unloading of the components from the insert.

In the light of the foregoing, the primary object of the invention is to make available a method of quickly and easily transferring electronic components, such as integrated circuit assemblies, from sticks or holders to inserts for centrifuge testing and for transferring the components from the insert to the holder or stick after testing.

A further object is to make available a hand-held tool constructed to cooperate between the insert of the centrifuge and the stick or holder so that the method of loading and unloading can be carried out most efficiently.

A further object is to achieve a significant reduction of time and labor in connection with the loading and unloading and to achieve this in a cost-effective way.

A further object is to realize the elimination of manual handling of individual parts or components and particularly to eliminate damage, such as bent pins or terminals.

A further advantage is realized in the elimination of damage through manual handling of individual parts, which results from dropping parts.

A further object is to realize the advantage that cartridge assemblies, that is, that part of the tool having the passageway through it which receives the end of the holder or stick, can be separately procured and quickly and easily interchanged in the hand grip part of the tool. Thus, the advantage is realized that the tool can be used with various configurations and sizes of component parts to be tested.

A further advantage is realized that cartridge assemblies can easily be provided for special custom situations.

A further object is that the advantage is realized that the tool itself is simple and is easily used, requiring virtually no instructions for its use.

Another object is the realization of the advantage of simplicity of maintenance and replacement of parts.

Further objects and advantages of the invention will become apparent from the following detailed description and annexed drawings.

BRIEF DESCRIPTION OF THE DRAWINGS

FIG. 1 is an isometric view of the tool of the invention showing a stick or holder and an integrated circuit element;

FIG. 2 is a partial cross-sectional view of an insert in the rotor of a centrifuge with the tool in position for dispensing components into the insert;

FIG. 3 is a cross-sectional view of a part of the insert and of the tool with the tool in position for blocking the dispensing of components into the insert;

FIG. 4 is a cross-sectional view similar to that of FIG. 3 with the trigger of the tool activated for unblocking the passageway through the cartridge of the tool to allow dispensing of components into the insert; and FIG. 5 is a side view of the tool positioned for unloading components from the insert by use of a push rod to eject them through the tool into the stick or holder.

DESCRIPTION OF A PREFERRED EMBODIMENT OF THE INVENTION AND BEST MODE OF PRACTICE

Referring to FIG. 1, a preferred form of tool or loading device is shown, the tool having an upper part or cartridge 10 and a downwardly extending handle 12. The cartridge has a top part 11 and a bottom part 13 secured together. Numeral 13 designates the holder or stick which holds the components to be loaded, thus constituting a holder or magazine. Preferably, the stick is formed from plastic having a cross-sectional shape, as shown in FIG. 1, this shape including an upturned bottom part, as designated at 14, so that a configuration is provided to accommodate solid-state components, such as that identified by numeral 16 to be loaded lengthwise into the stick. The microelectronic component 16 includes a body part 18 which may be formed of ceramic with a plurality of extending legs or terminals 19 on each side of the ceramic body. Thus, it may be seen that the stick 13 has a configuration to receive the components 16 in it lengthwise. The opposite side of the tool, that is, of the cartridge 10 and the handle 12, may be seen in FIG. 2.

The cartridge 10 is generally rectangular, having a pair of upstanding ears at the top, as may be seen at 24 and 26. At the front side of the cartridge 10 is a part 30 which will be referred to again presently, and at the back side of the cartridge 10 is a portion 32 which fits into the inside of the handle 12 in an opening as identified at 34. See FIG. 3. The cartridge is fastened to the handle by way of a cap screw 36 which extends into the portion 32, as may be seen in FIGS. 3 and 4.

The cartridge has a channel extending through it, having a cross-sectional shape corresponding to the configuration of the stick 13, that is, corresponding to the channel within the stick. This channel in the cartridge is identified by the numeral 40, the configuration of the channel as described being provided by way of an upstanding part 42 extending upwardly from the bottom of the cartridge 10.

At the front side of the cartridge 10 is a pair of extending locating pins 44 and 46. These locating pins are received in an insert in the rotor of the centrifuge, as will be described, for positioning the tool when in use.

The tool has a control member or trigger, as designated at 50, which is pivoted in the opening 34 in the handle 12, the pivot being identified by the numeral 52. The control or trigger member has a round opening in it, as designated at 54, in which is positioned a coil spring 56 which biases the trigger in a clockwise direction, the other end of the spring being received in a hole or opening 60 in the handle 12. 4 Numeral 64 designates a plunger which is journaled in a bore 66 in the part 30. The plunger 64 extends through a bore in the part 42, as may be seen in FIG. 1, so as to be able to come into a position to obstruct the passageway or channel 40 through the cartridge 10. At the end of the plunger member 64 is a yoke 66 which engages a pin 68 positioned in a rectangular cut-out 69 in the trigger 50.

See FIG. 4. The trigger the plunger 64 so as to See FIG. 4. The trigger can operate either obstruct the passageway or channel through the cartridge 10 or to leave the channel unobstructed, as will be described more in detail presently.

Numeral 72 designates the rotor of the centrifuge. Centrifuges are well-known in the art, as well as the rotors within them which are rotated by the centrifuge in order to apply the G forces. Numeral 74 designates an insert which can fit within the rotor 72 and which is removable therefrom. In the form of insert shown, it has a plurality of axially disposed extrusions, as shown at 80. The insert is configured to receive the extrusions. The extrusions have a shape shown at 80 having a base part 82 and extending legs 83 and 84. As stated, the extrusions are axially positioned. Each one of them is positioned to receive one of the components, such as identified at 16, between the legs 83 and 84 of the extrusion to hold it in position while the centrifugal forces are being applied. The insert may be of a type having machined slots to receive the components.

The mode of utilization of the loading device or tool is illustrated in FIGS. 1 through 5. The components, as shown at 16, are loaded into the holder or stick 13, and a plug insert, as shown at 86, may be used in the end of the stick 13 to prevent the components from coming out that end.

The insert 74 can be removed from the rotor 72 in the centrifuge. Preferably, the electronic components are then loaded into the insert while it is in a vertical position. In loading, the device or tool is in a position as illustrated in FIG. 2. The positioning prongs 44 and 46 fit into holes in the insert 74 so as to accurately position the tool for having components, such as the component 16, to pass through the channel in the tool and then into a position in one of the extrusions 80. The prongs or pins 44 and 46 also may simply nest between adjacent parts of the extrusions 80.

FIG. 3 shows the insert 74 and the tool and the holder or stick 13 in a horizontal position, but as indicated, preferably, loading is done with the insert 74 having its axis in a vertical position so that the components can pass by gravity through the tool and into an extrusion in the insert.

The end of the loaded stick is inserted into the channel 40 in the cartridge and is held by compression friction by the spring-like action of the plastic stick walls.

FIG. 3 shows the tool with the trigger 50 not activated so that the plunger 64 is in a position with respect to the cartridge to prevent electrical components, such as 16, from passing from the stick 13 into an extrusion, through channel 40.

FIG. 4 illustrates the control member or trigger 50 rotated counterclockwise against the spring 56 so that the plunger 64 is retracted downwardly by way of the yoke 66 and the pin 68 so that the passageway 40 through the carriage 10 is not obstructed to allow the components to pass into an extrusion 80. In this manner, the components are loaded into the extrusions 80 in the insert 74 which then can be replaced into the rotor 72 in the centrifuge.

FIG. 5 illustrates a preferred manner of unloading electronic components from the rotor 72. For doing this, preferably, the insert 74 is positioned with its axis horizontal. Just as in the loading process, an end of the stick or holder 13 is inserted into the channel 40 in the cartridge 10 of the tool so that it is held in that position for components, such as 16, to pass through the channel and back into the stick. To facilitate this, the insert has holes in it, as designated at 90, through which a rod, as designated at 92 in FIG. 5, can be inserted so that the rod will abut against the end of a component, such as 16, in one of the extrusions 80 so that by pushing on the rod, the components can be pushed out through the channel 40 in the tool and back into the stick 13. In this manner, all of the components can be unloaded from the insert 74.

From the foregoing, those skilled in the art will understand the nature and construction of the invention and the manner in which it is utilized for its purpose of loading and unloading components from the rotor insert. The foregoing disclosure is representative of a preferred form of the structure and method of the invention and is to be interpreted in an illustrative sense, it being intended that the claims appended hereto shall cover the form of the invention disclosed as well as a range of equivalents. The method can be effectuated by way of some variations in the method as well as in the actual physical construction of the tool.

What is claimed is:

1. A method of testing the mechanical integrity of electronic components, including placing in a centrifuge an insert having receptacles to receive the components to be tested in circular positions about the axis of the insert, with the components aligned along a line parallel to the axis of the centrifuge, loading the electronic components into a holding element so that the components are positioned to be released from the holding element, and positioning a control device in a position between the holding element and the insert and causing the components to move from the holding element into the receptacles in the said insert.

2. A method as in claim 1, including providing a channel in the said control device of a shape to accommodate components passing through it.

3. A method as in claim 1, including the step of unloading the components from the centrifuge, including moving the components axially in the receptacles in the insert through the said control device and receiving the components in the holding element as they are moved out of the receptacles.

4. The method as in claim 1, including controlling the movement of the components from the holding element into the receptacles, the control including starting the movement of components and stopping the movement of components.

5. The method as in claim 1, including placing the control device in a position between the end of the holding element and the receptacles and controlling the movement of the components.

6. In the art of centrifuging electronic components to test their mechanical integrity wherein there is provided a centrifuge having a rotor, an insert insertable into the rotor, the insert having receptacle openings for receiving electronic components to be tested, a holder for holding the electronic components, having a shape to hold components within the holder and to allow the components to be dispensed therefrom, a device constructed to be positioned adjacent a receptacle opening for controlling the dispensing of components from the holder into the opening, the device having a passageway through it shaped to receive the end of the holder whereby the components can pass from the holder through the passageway and into the receptacle opening, the device having control means whereby to allow passage of components and to obstruct passage of components.

7. The substance of claim 6 wherein the control means of the device comprises a movable member operable to obstruct the passageway and to unobstruct the passageway and manual means for operating the said member.

8. The substance as in claim 7 wherein the passageway through the device has a configuration conformable to the shape of the components received from the holder.

9. The substance as in claim 8 wherein the device has an upper part having the said passageway through it and the control means, the device having an extending grip part and a trigger for operating the control member.

10. The substance as in claim 9 wherein the device is in the form of a hand tool, the said hand tool having a trigger and said movable member being in the form of a plunger operable by the trigger.

11. The substance as in claim 10 wherein the said upper part is detachable from the extending grip part.

* * * * *